United States Patent
Kuroda

(10) Patent No.: US 6,252,775 B1
(45) Date of Patent: *Jun. 26, 2001

(54) ELECTRONIC APPARATUS HAVING PRINTED CIRCUIT BOARD MODULE ACCOMMODATED IN CASE THEREOF

(75) Inventor: Yoshikatsu Kuroda, Komaki (JP)

(73) Assignee: Mitsubishi Heavy Industries, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/154,399

(22) Filed: Sep. 16, 1998

(30) Foreign Application Priority Data

Sep. 19, 1997 (JP) ................................. 9-255124

(51) Int. Cl.[7] ........................................ H05K 7/20
(52) U.S. Cl. .......................... 361/707; 361/719; 361/802
(58) Field of Search ................... 165/80.3, 185; 211/41.17; 361/704, 707, 708, 710, 711, 717–719, 792, 795, 796, 801, 802

(56) References Cited

U.S. PATENT DOCUMENTS

| | | |
|---|---|---|
| 4,298,904 | 11/1981 | Koenig . |
| 4,480,287 | 10/1984 | Jensen . |
| 4,650,923 | 3/1987 | Nishigaki . |
| 4,730,232 | 3/1988 | Lindberg . |
| 4,849,858 | 7/1989 | Grapes . |
| 4,963,414 | 10/1990 | Le Vasseur . |
| 5,414,592 | 5/1995 | Stout . |
| 5,432,675 | 7/1995 | Sorimachi . |
| 5,485,353 | 1/1996 | Hayes . |
| 5,859,764 | 1/1999 | Davis . |

Primary Examiner—Gerald Tolin
(74) Attorney, Agent, or Firm—John P. White; Cooper & Dunham LLP

(57) ABSTRACT

An electronic apparatus comprising a case which accommodates a printed circuit board module is disclosed. The printed circuit board module comprises a metal-type printed circuit board having a metal plate, an insulating-material layer formed on the metal plate and a conductive-material layer formed on the insulating-material layer and electronic elements mounted on the metal-type printed circuit board. A forcible cooling portion having radiating fins is joined to the outer surface of the case.

9 Claims, 3 Drawing Sheets

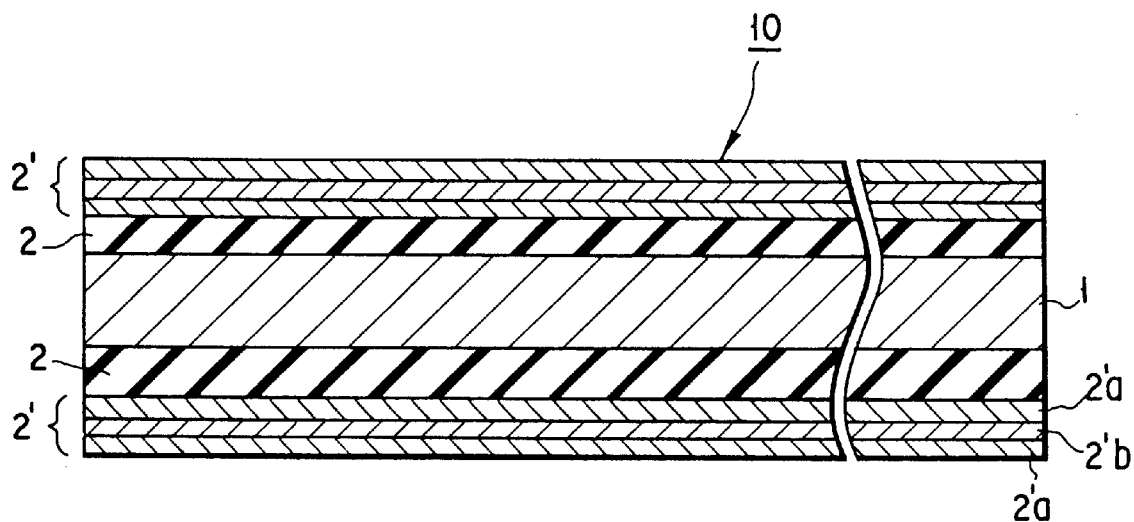
F I G. 3

ELECTRONIC APPARATUS HAVING PRINTED CIRCUIT BOARD MODULE ACCOMMODATED IN CASE THEREOF

BACKGROUND OF THE INVENTION

The present invention relates to an electronic apparatus having a printed circuit board module accommodated in a case thereof, the printed circuit board module having electronic elements, such as integrated circuit devices (hereinafter called "IC devices"), mounted thereon.

A conventional electronic apparatus of the foregoing type will now be described with reference to FIG. 1. As shown in FIG. 1, a printed circuit board module 100 has a printed circuit board (hereinafter called a "resin-type printed circuit board") 8 in the form of a resin plate having signal lines formed thereon. On the printed circuit board 8, there are mounted electronic elements 3, such as IC devices, resistors, capacitors by soldering or the like. Ends of the resin-type printed circuit board 8 are placed in joining portions 4a formed in a case 4. Metal pressing members 5 are inserted between inner walls of the joining portions 4a and the ends of the resin-type printed circuit board 8. Thus, the printed circuit board module 100 is fixed to the inside portion of the case 4.

The resin-type printed circuit board 8 of the conventional electronic apparatus having the above-mentioned structure suffers from unsatisfactory thermal conductivity. Thus, heat generated by the electronic elements 3, such as the IC devices, cannot easily effectively be relieved to the case 4 through the resin-type printed circuit board 8. When the electronic elements 3 are the IC devices, the temperatures at junctions of the IC devices cannot be lowered. As a result, reliability of the operations of the IC devices deteriorates. Thus, reliability of the operations as the electronic apparatus excessively deteriorates.

An object of the present invention is to provide an electronic apparatus having a printed circuit board module accommodated in a case thereof and exhibiting satisfactory operation reliability.

BRIEF SUMMARY OF THE INVENTION

An electronic apparatus according to the present invention comprises a case which accommodates a printed circuit board module, wherein the printed circuit board module comprises:
- a metal-type printed circuit board having a metal plate, an insulating-material layer formed on the metal plate and a conductive-material layer formed on the insulating-material layer; and
- electronic elements mounted on the metal-type printed circuit board.

In the electronic apparatus according to the present invention and having the above-mentioned structure, heat generated by the electronic elements can effectively be relieved to the case through the conductive-material layer constituting the metal-type printed circuit board. When a forcible cooling portion is provided for the case, heat generated in the electronic elements can furthermore efficiently be radiated. As a result, the rise in the temperatures of the electronic elements can be prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 3 is a cross sectional view showing a metal-type printed circuit board according to the embodiment;

DETAILED DESCRIPTION OF THE INVENTION

Figure 1:
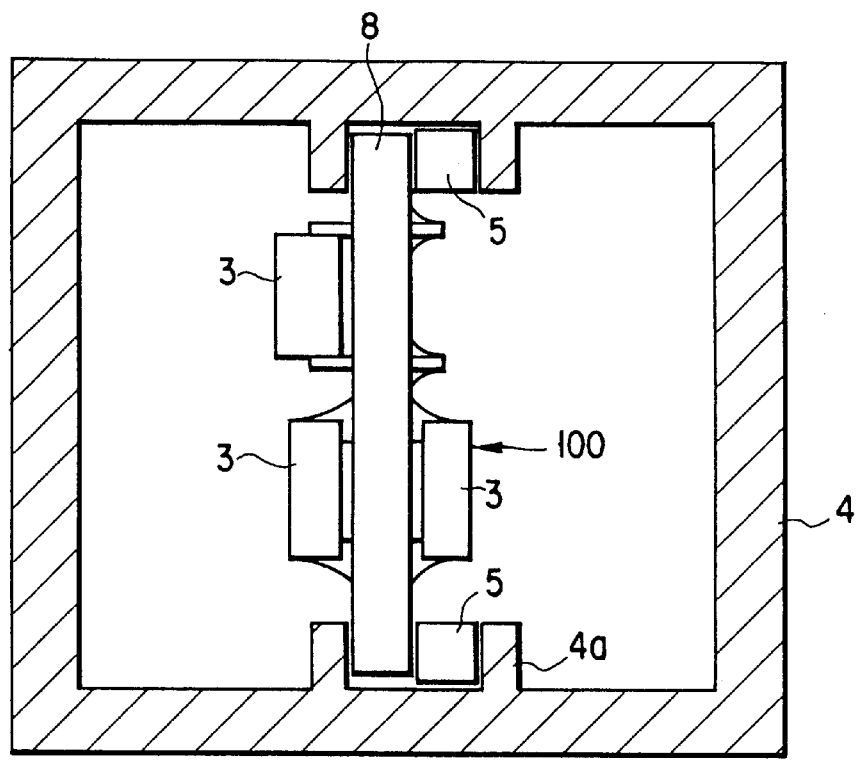
FIG. 1 is a cross sectional view showing an example of a conventional electronic apparatus.
Figure 2:
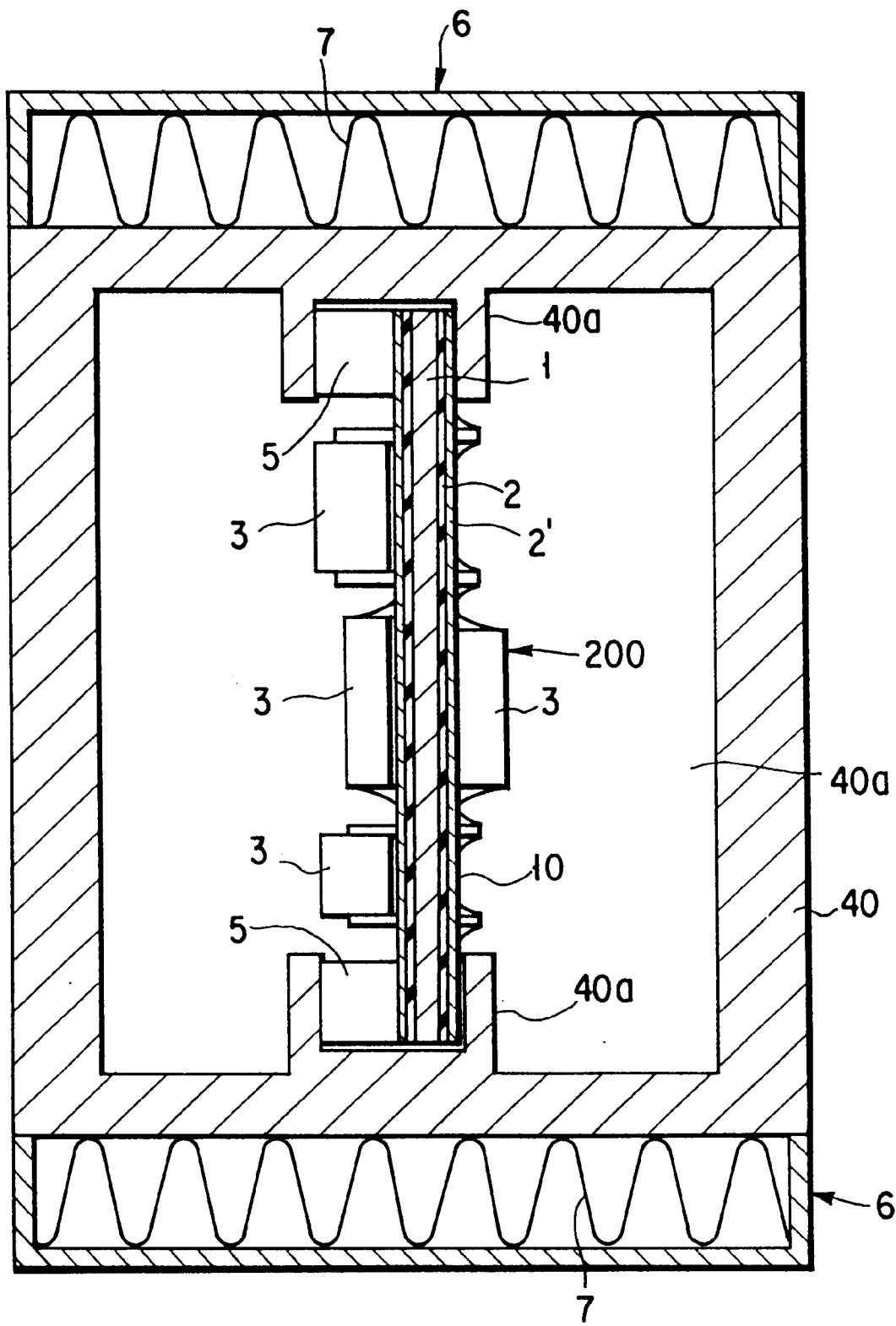
FIG. 2 is a cross sectional view showing an embodiment of an electronic apparatus according to the present invention.

An embodiment of the present invention will now be described with reference to FIGS. 2 to 4.

An electronic apparatus according to the present embodiment comprises a case 40. Slot-shape joining portions 40a are formed in the upper and lower inner walls of the case 40. A forcible cooling portion 6 is formed on each of upper and lower outer walls of the case 40.

A printed circuit board module 200 is accommodated in the case 40. The printed circuit board module 200 is constituted by mounting electronic elements 3, such as IC devices, resistors and capacitors, on a metal-type printed circuit board 10 by soldering or the like.

The metal-type printed circuit board 10 is composed of a metal plate 1 comprising Ti, Al, Fe—Ni alloy or mixture thereof, an insulating-material layer 2 comprising $Al_2O_3$ which is formed on each of two surfaces of the metal plate 1 and a conductive-material layer 2' comprising Cr and Au each of which has satisfactory thermal conductivity on the surface of the insulating-material layer 2.

A metal pressing member 5 is inserted into a portion between the inner wall of each of the joining portions 40a and the end of the metal-type printed circuit board 10. Thus, the printed circuit board module 200 is fixed to the inside portion of the case 40. The forcible cooling portions 6 according to the present embodiment are heat sink portions each incorporating radiating fins 7.

As shown in FIG. 3, the insulating-material layer 2 is formed on each of the two surfaces of the metal plate 1 which has a thickness of about 1.0 mm, by a vacuum evaporation method to from the insulating-material layer 2 having a thickness of 3 $\mu$m. The conductive-material layer 2' is formed by a Cr layer 2' $a$ (having a thickness of 0.1 $\mu$m), an Au layer 2' $b$ (having a thickness of 0.1 $\mu$m) and a Cr layer 2' $a$ (having a thickness of 0.1 $\mu$m) which are formed on the insulating-material layer 2 in this sequential order by a vacuum evaporation method (under conditions that a degree of vacuum is $10^{-7}$ and the temperature of the board is 250° C.).

Figure 4:
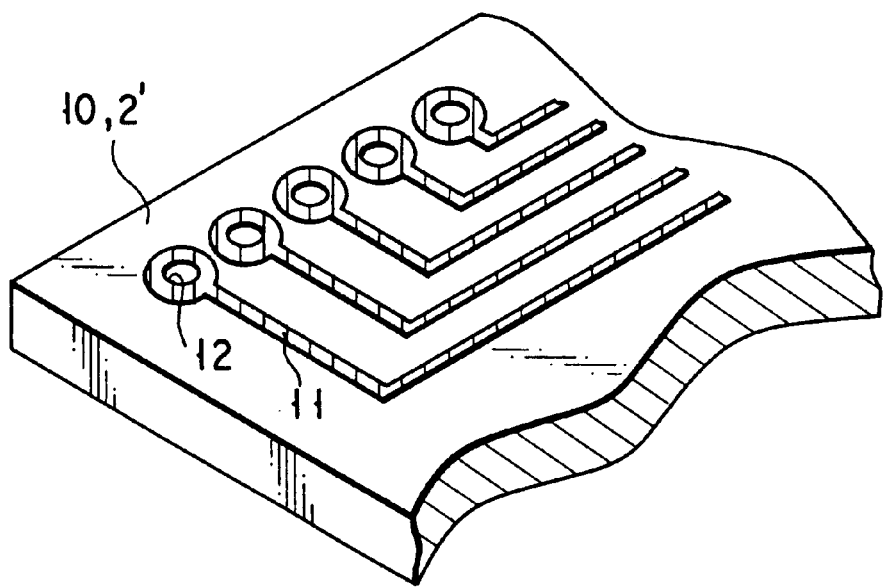
FIG. 4 is a partial perspective view showing the metal-type printed circuit board according to the embodiment.

As shown in FIG. 4, the conductive-material layer 2' of the metal-type printed circuit board 10 has signal lines 11 including through holes 12 or the like and formed by a screen vacuum evaporation method, a chemical etching method or the like.

In the electronic apparatus having the above-mentioned structure and according to the present embodiment, heat generated by the electronic elements 3 can efficiently be transmitted from the surfaces of the electronic elements 3 to the case 40 and its forcible cooling portions 6 through the conductive-material layer 2' having satisfactory thermal conductivity and the metal pressing members 5. Thus, heat is radiated and rise in the temperatures of the electronic elements 3 can be prevented. As a result, the life of each of the electronic elements 3 can be elongated.

In the present embodiment, forcible cooling is not required in the case 40 and sufficient heat radiation can be carried out. Thus, the size and cost of the electronic apparatus can be reduced.

The electronic apparatus according to the present embodiment has the structure that the signal lines of the electronic elements 3 are formed in the conductive-material layer 2' of the metal-type printed circuit board 10. Therefore, the signal lines are free from 25 occurrence of crosstalk or generation of noise.

The metal-type printed circuit board 10 of the electronic apparatus according to the present embodiment has the structure that the metal plate 1, the insulating-material layer 2 and the conductive-material layer 2' made of a metal material are formed in this sequential order. Therefore, the strength can be improved and the difference in the thermal expansion among materials can be prevented as compared with a conventional resin-type printed circuit board. Thus, vibration resistance, acceleration resistance and temperature cycle resistance can significantly be improved.

In the aforementioned embodiment, the insulating-material layers 2 on the two surfaces of the metal plate 1 and the conductive-material layers 2' on the insulating-material layers 2 are formed by the vacuum evaporation method. However, a method (a CVD method) with which a film is formed by using chemical reactions or a plating method may be employed.

Figure 5:
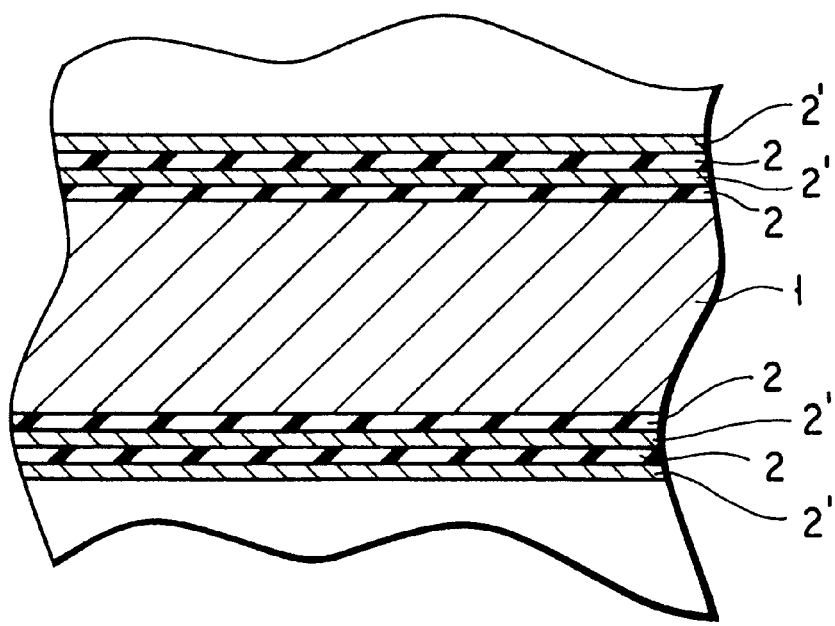
FIG. 5 is a cross sectional view showing a modification of the metal-type printed circuit board.

The electronic apparatus according to the present embodiment has the structure that the conductive-material layers 2' are formed on the insulating-material layers 2 each of which is in the form of a single layer. However, the two layers 2 and 2' may repeatedly be formed as shown in FIG. 5 so as to form the conductive-material layers 2' at the outermost layers on which the electronic elements 3 are mounted.

As a matter of course, the materials of the insulating-material layers and the conductive-material layers according to the present invention are not limited to those according to the aforementioned embodiment.

As described above, according to the present invention, heat generated by the electronic elements can efficiently be radiated through the conductive-material layers and the radiating fins. Moreover, stable signal lines can be formed on the surface of the board. In addition, the size of the apparatus can be reduced.

Therefore, the electronic apparatus according to the present invention is able to elongate the life of electronic elements. The electronic apparatus can be used under severe conditions in terms of high temperatures and vibrations.

Further, the electronic apparatus according to the present invention can be used as a high thermal density electronic apparatus for a super computer or the like. In addition, the electronic apparatus according to the present invention can be used as an electronic apparatus which must perform a high speed signal processing operation.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic apparatus comprising:

a printed circuit board module; and a case which accommodates said printed circuit board module;

wherein said printed circuit board module includes
a metal plate;
an insulating layer formed on said metal plate, the insulating layer being formed by a vacuum evaporation method;
a conductive-material layer formed on said insulating material layer, the conductive-material layer being formed by a vacuum evaporation method; and
electronic elements mounted on said conductive-material layer, and said case directly contacts said conductive-material layer to transmit heat from said printed circuit board module.

2. An electronic apparatus according to claim 1, further comprising a forcible cooling portion joined to the outer surface of said case.

3. An electronic apparatus according to claim 2, wherein said forcible cooling portion comprises radiating fins.

4. An electronic apparatus according to claim 1, further comprising metal pressing members for pressing ends of said printed circuit board module against predetermined inner walls of said case.

5. An electronic apparatus according to claim 1, wherein said metal plate comprises Ti, Al, Fe—Ni alloy or mixture thereof.

6. An electronic apparatus according to claim 1, wherein said insulating layer comprises $Al_2O_3$.

7. An electronic apparatus according to claim 1, wherein said conductive-material layer comprises Cr and Au on the insulating-material layer.

8. An electronic apparatus according to claim 1, wherein said conductive-material layer is formed by sequentially stacking Cr, Au and Cr on the insulating-material layer.

9. An electronic apparatus according to claim 1, wherein said metal-type printed circuit board has signal lines for mounting the electronic elements, and said signal lines are formed on said metal-type printed circuit board by processing said conductive-material layer.

* * * * *